United States Patent [19]

Havel et al.

[11] 4,302,688
[45] Nov. 24, 1981

[54] SOLID-STATE RELAY

[75] Inventors: Jiri Havel, Rappersdorf; Dieter Schicketanz, Munich; Hans Stut, Gröbenzell, all of Fed. Rep. of Germany

[73] Assignee: Siemens Aktiengesellschaft, Berlin and Munich, Fed. Rep. of Germany

[21] Appl. No.: 47,045

[22] Filed: Jun. 11, 1979

[30] Foreign Application Priority Data

Jul. 25, 1978 [DE] Fed. Rep. of Germany ....... 2832590

[51] Int. Cl.$^3$ ............................................. H03K 17/72
[52] U.S. Cl. ........................... 307/252 J; 307/252 W; 307/318
[58] Field of Search ........... 307/252 B, 252 N, 252 T, 307/252 J, 252 W, 252 VA, 318

[56] References Cited

U.S. PATENT DOCUMENTS 3,641,397 2/1972 Elliot et al. ..................... 307/252 W
3,723,769 3/1973 Collins ............................. 307/252 B Primary Examiner—John Zazworsky
Attorney, Agent, or Firm—Herbert L. Lerner

[57] ABSTRACT

Solid state relay with a full-wave rectifier bridge having d-c output terminals, a thyristor, the anode and cathode of which being respectively connected to the output terminals of the rectifier bridge, a first and a second transistor, the load circuits of which being shunted across the gate-cathode path of the thyristor, the control terminal of the first transistor being connected to a first and a second resistor, the first resistor being, in turn, connected to the anode of the thyristor, and the second resistor being, in turn, connected to the cathode of the thyristor, the control terminal of the second transistor being connected to a third resistor and to a control transistor, the third resistor being, in turn, connected to the anode of the thyristor, and the control transistor being connected to the cathode of the thyristor, including a Zener diode connected in series with the first resistor.

2 Claims, 1 Drawing Figure

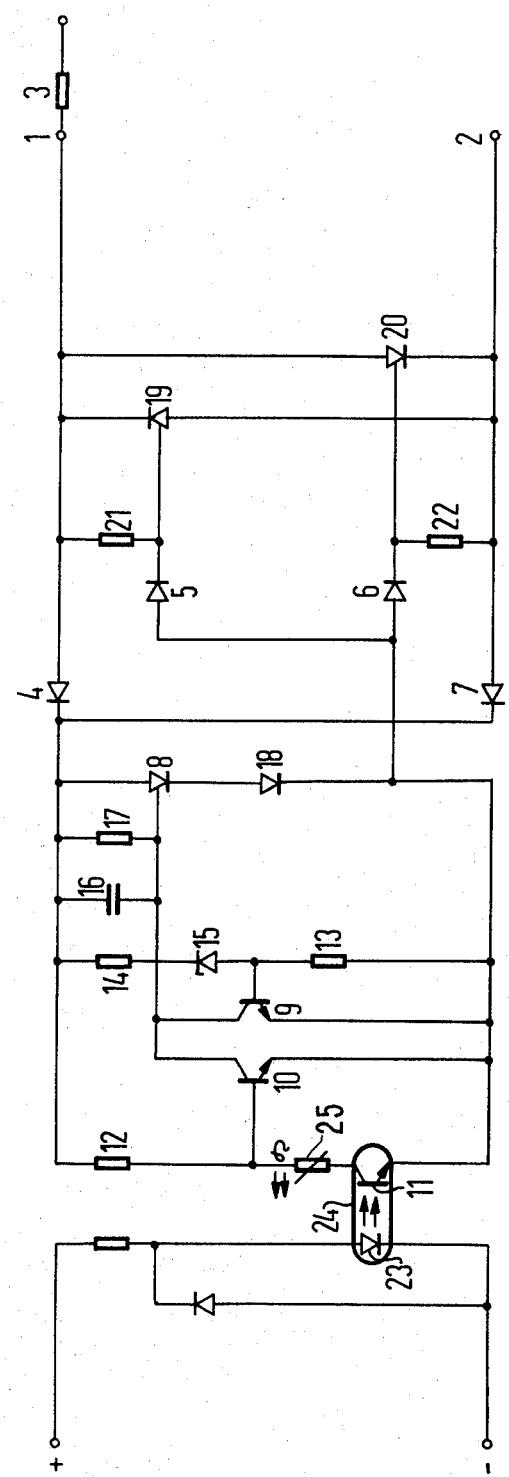

SOLID-STATE RELAY

The present invention relates to a solid-state relay comprising a full-wave rectifier bridge, the d-c terminals of which are connected to the cathode and the anode, respectively, of a thyristor, and two transistors, the load circuits of which are shunted across the gate-cathode path of the thyristor. The control terminal of the first transistor being connected through resistors to each of the anode and the cathode, respectively, of the thyristor. The control terminal of the second transistor being connected through a resistor to the anode, and through a control transistor to the cathode of the thyristor.

A solid-state relay of this type has already been described in the prior art. It is desirable for such a relay to switch only in the vicinity of the zero crossing of the a-c voltage when a control signal is applied. If a control signal is applied and if the a-c voltage differs only a little from zero, then the thyristor is fired which, in turn, depending on the phase of the a-c voltage, furnishes the firing current for one of two anti-parallel-connected thyristors or for a bidirectional thyristor (Triac). In order to prevent the thyristor from firing if the a-c voltage is significantly different from zero, the base-cathode path of the thyristor is shunted by the load circuit of a transistor. The control input of the transistor is connected to the tap of a voltage divider supplied with the rectified a-c voltage. If the rectified a-c voltage increases, the transistor conducts, the gate-cathode path of the thyristor is short-circuited and it is therefore not possible for the thyristor to fire, and for the whole relay to switch on.

The gate-cathode path of the thyristor is shunted by the load circuit of a second transistor which, in turn, is controlled by a control transistor. As long as the control transistor is not switched into conduction by a control voltage, the second transistor conducts and prevents the thyristor from being fired regardless of the instantaneous value of the rectified a-c voltage.

With the construction of the circuit fixed, the magnitude of the rectified a-c voltage at which the first transistor becomes conducting depends on the properties of the first transistor. Since these properties are subject to an unavoidable spread, the switching-on voltage of the first transistor (zero voltage switch) also differs from relay to relay.

It is therefore an object of the invention to provide a solid-state relay which overcomes the hereinafore-mentioned disadvantages of the heretofore known devices of this general type, and to further develop a circuit arrangement of the type mentioned in such a manner that the zero-voltage switch switches-on substantially independently of deviations from unit to unit.

With the foregoing and other objects in view, there is provided, in accordance with the invention, solid-state relay with a full-wave rectifier bridge having d-c output terminals, a thyristor, the anode and cathode of which being respectively connected to the output terminals of the rectifier bridge, a first and a second transistor, the load circuits of which being shunted across the gate-cathode path of the thyristor, the control terminal of the first transistor being connected to a first and a second resistor, said first resistor being, in turn, connected to the anode of the thyristor, and the second resistor being, in turn, connected to the cathode of the thyristor, the control terminal of the second transistor being connected to a third resistor and to a control transistor, the third resistor being, in turn, connected to the anode of the thyristor, and the control transistor being connected to the cathode of the thyristor, comprising a zener diode connected in series with the first resistor.

In accordance with a concomitant feature of the invention, there is provided a diode connected in series with the gate-cathode path of the thyristor.

Other feature which are considered as characteristic for the invention, are set forth in the appended claims.

Although the invention is illustrated and described herein as embodied in solid-state relay, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying single FIGURE of the drawing which is a circuit diagram for the solid state relay according to the invention.

Referring now particularly to the FIGURE of the drawing, it is seen that the solid-state relay has two input terminals 1 and 2 and is connected to an a-c voltage through a load 3. A full-wave rectifier bridge with the diodes 4, 5, 6, 7 is connected to the input terminals 1, 2 through resistors 21, 22. The anode and cathode, respectively, of a thyristor 8 are connected to the output terminals of the rectifier bridge. The gate-cathode path of the thyristor 8 is shunted by the collecter-emitter paths of a first transistor 9 and a second transistor 10. The base terminal of the transistor 9 is connected through a resistor 13 to the cathode of the thyristor 8 and, through a Zener diode 15 and a resistor 14 connected in series therewith, to the anode of the thyristor 8. The base or control terminal of the second transistor 10 is connected through a resistor 12 to the anode of the thyristor and through the load circuit of a control transistor 11 to the cathode of the thyristor 8. The collector of the transistors 9, 10 are likewise connected to the anode of the thyristor 8 through a parallel circuit having a capacitor 16 and a resistor 17.

To explain the operation of the solid-state relay, it is assumed that the instantaneous value of the rectified a-c voltages varies so slightly from zero so as to permit switching of the solid-state relay. The cutoff voltage of transistor 9, which works as a zero switch, is determined by the Zener diode 15. As long as the Zener voltage is not reached, the transistor 9 is cut off. If the control transistor 11 is switched into conduction by an external control variable, the transistor 10 is cut off also, and the gate terminal of the thyristor 8 obtains a large control current through the R-C circuit 16, 17, and fires. The load current through thyristor 8 then flows through the diodes 5 and 6 of the rectifier bridge to the control terminals of anti-parallel-connected thyristors 19, 20 which are disposed in the a-c circuit. Depending on whether the a-c voltage happens to have positive values at terminal 1 or 2, either thyristor 19 or thyristor 20 is switched into conduction. The solid-state relay is thereby switched on and current flows through the load 3.

As a second mode of operation, it is assumed that the instantaneous value of the a-c voltage is already so large that the solid-state relay should no longer switch. This voltage is determined by the Zener voltage of the Zener diode 15. If the Zener voltage is exceeded, the transistor 9 is driven. The collector-emitter path of transistor 9 thereby short-circuits the gate-cathode path of thyristor 8, and firing the thyristor is no longer possible. Firing the thyristor is also not possible if a control voltage is applied to the input of the solid-state relay, since both transistors 9 and 10 are connected parallel to each other. The voltage at which the solid-state relay must no longer switch is therefore largely independent of deviations of the transistors 9 used as the zero switch from unit to unit. In this way, a better-defined closing characteristic is achieved.

Since the turn off time of the thyristor 8 is subject to a spread from unit to unit, there is a possibility that the thyristor 8 will not be extinguished even at the zero crossing of the rectified voltage, if the available turn off time is too short. In such cases it is advisable to insert a diode 18 into the cathode lead of the thyristor 8. The threshold voltage of the rectifier construction formed by the thyristor 8 and the diode 18 is thereby increased. It may be doubled, for instance, and the thyristor 8 will be safely extinguished. With this measure, an improvement of the opening characteristic is therefore obtained.

A PTC (positive temperature coefficient) resistor 25 can be connected in series with the control transistor 11. This protects the relay against overtemperature effects. The arrows and symbol shown indicate that it is a resistor which is temperature dependent.

The resistors 12, 14 may have a resistance of, for instance, 560 K (kilo-ohms), the resistor 17, 100 K and the resistor 13, 22 K. The capacitor 16 may have a capacity of, for instance, 100 pF and the Zener diode 15, a Zener voltage of 9 V. The resistance of the resistors 21, 22 may be, for instance, approximately 47 ohms.

It is claimed:

1. Solid-state relay with a full-wave rectifier bridge having d-c output terminals, a thyristor having a gate-cathode path, the anode and cathode of which being respectively connected to the output terminals of the rectifier bridge, a first and a second transistor each having a load circuit, the load circuits being shunted across the gate-cathode path of the thyristor, the control terminal of the first transistor being connected to a first and a second resistor, the first resistor being in turn connected to the anode of the thyristor, and the second resistor being in turn connected to the cathode of the thyristor, the control terminal of the second transistor being connected to a third resistor and to a control transistor, the third resistor being in turn connected to the anode of the thyristor, and the control transistor being connected to the cathode of the thyristor, comprising a Zener diode connected in series with the first resistor.

2. Solid-state relay according to claim 1, including a diode connected in series with the gate-cathode path of the thyristor.

* * * * *